US012633910B2

(12) United States Patent
Abouda et al.

(10) Patent No.: US 12,633,910 B2
(45) Date of Patent: May 19, 2026

(54) SWITCH

(71) Applicant: NXP USA, INC., Austin, TX (US)

(72) Inventors: Pascal Kamel Abouda, Saint Lys (FR);
Patrice Besse, Tournefeuille (FR);
Alain Salles, Pechbusque (FR); **Olivier
Tico, St Lys (FR); Evgueniy Nikolov
Stefanov, Vieille Toulouse (FR); Khalil
Jradi, Donneville (FR); Arlette
Marty-Blavier**, Seysses (FR)

(73) Assignee: NXP USA, Inc., Austin, TX (US)

( * ) Notice: Subject to any disclaimer, the term of this
patent is extended or adjusted under 35
U.S.C. 154(b) by 82 days.

(21) Appl. No.: 18/886,224

(22) Filed: Sep. 16, 2024

(65) Prior Publication Data

US 2025/0112630 A1      Apr. 3, 2025

(30) Foreign Application Priority Data

Sep. 29, 2023    (EP) .................................... 23306650

(51) Int. Cl.
  *H03K 17/08*       (2006.01)
  *H03K 17/0812*     (2006.01)
  *H10D 89/60*       (2025.01)
  *H10D 8/25*        (2025.01)

(52) U.S. Cl.
  CPC ..... *H03K 17/08122* (2013.01); *H10D 89/611*
    (2025.01); *H10D 8/25* (2025.01)

(58) Field of Classification Search
  CPC ... H03K 17/08122; H10D 89/611; H10D 8/25
  See application file for complete search history.

(56) References Cited

U.S. PATENT DOCUMENTS

| | | | |
|---|---|---|---|
| 5,689,209 | A | 11/1997 | Williams et al. |
| 7,092,227 | B2 | 8/2006 | Ker et al. |
| 9,263,428 | B2 | 2/2016 | Russ et al. |
| 11,128,117 | B2 * | 9/2021 | Takahashi .............. H02H 3/003 |
| 2012/0161232 | A1 | 6/2012 | Farbiz et al. |
| 2023/0268338 | A1 | 8/2023 | Galy |

OTHER PUBLICATIONS

PCT Application No. PCT/EP2023/086539 filed on Dec. 19, 2023,
entitled "A Switching Circuit for Cell Balancing in a Battery
Management System".

* cited by examiner

*Primary Examiner* — Daniel C Puentes

(57)      ABSTRACT

A switch arrangement comprising: a bi-directional metal-
oxide-semiconductor, MOS, switch having a drain, source
and gate and a body; a first circuit coupled between the
drain, the gate and the source for providing electrostatic
discharge protection; a first transistor having a source
coupled to the body of the MOS switch, a drain coupled to
the source of the MOS switch and a gate coupled to the gate
of the MOS switch; and a second circuit for providing
electrostatic discharge protection comprising a first diode of
Zener diode type having an anode coupled to the body of the
MOS switch and a cathode coupled to the source, and a
second transistor having a source coupled to the body of the
MOS switch, a drain coupled to the source of the MOS
switch and a gate coupled to the anode of the first diode.

20 Claims, 2 Drawing Sheets

100

SWITCH

CROSS-REFERENCE TO RELATED APPLICATIONS

This application claims the priority under 35 U.S.C. § 119 of European Patent application no. 23306650.5, filed on 29 Sep. 2023, the contents of which are incorporated by reference herein.

FIELD

The present disclosure relates to a switch, such as a bi-directional MOS-based switch. In particular, it relates to a bi-directional MOS-based switch arrangement including electrostatic discharge protection.

BACKGROUND

A transistor may be used as a switch. In particular, a MOS based switch, such as a MOSFET, may be used as a bi-directional switch. A switch, like any other component, may experience electrostatic discharge, ESD, events and may need protection against potential damage caused by ESD. Further, such switches may be hot-plugged, such that they are connected to a battery or other energy source without control of the stress applied to the switch. Effectively protecting a switch from ESD and hot-plug events presents a challenge.

SUMMARY

According to a first aspect of the present disclosure there is provided a switch arrangement comprising:

a bi-directional metal-oxide-semiconductor, MOS, switch having a drain terminal, a source terminal, a gate terminal and a body;

a first circuit coupled between the drain terminal, the gate terminal and the source terminal for providing electrostatic discharge protection;

a first transistor having a source terminal coupled to the body of the MOS switch, a drain terminal coupled to the source terminal of the MOS switch and a gate terminal coupled to the gate terminal of the MOS switch; and a second circuit for providing electrostatic discharge protection comprising a first diode of Zener diode type having an anode terminal coupled to the body of the MOS switch and a cathode terminal coupled to the source terminal, and a second transistor having a source terminal coupled to the body of the MOS switch, a drain terminal coupled to the source terminal of the MOS switch and a gate terminal coupled to the anode terminal of the first diode.

In one or more embodiments, the second circuit further comprises a first resistor having a first terminal coupled to the body of the MOS switch and a second terminal coupled to the anode terminal of the first diode such that the anode terminal of the first diode is coupled to the body of the MOS switch via the first resistor.

In one or more embodiments, the first circuit comprises:

a second diode of Zener diode type and a third diode, wherein a cathode terminal of the second diode is coupled to the drain terminal and an anode terminal of the second diode is coupled to an anode terminal of the third diode, and the cathode terminal of the third diode is coupled to the gate terminal.

In one or more embodiments, the first circuit further comprises a second resistor connected between the gate terminal and the source terminal.

In one or more embodiments, the first transistor comprises an nMOS MOSFET.

In one or more embodiments, the second transistor comprises an nMOS FET.

In one or more embodiments, the second transistor comprises an NPN transistor.

In one or more embodiments, the MOS switch is provided with an on-resistance lower than the on-resistance of the first transistor.

In one or more embodiments, MOS switch is an n-channel MOS switch. In one or more embodiments, MOS switch is an p-channel MOS switch and wherein the first circuit and the second circuit may be coupled with the other of the source terminal and the drain terminal.

In one or more embodiments, a forward threshold voltage of the third diode plus a Zener voltage of the second diode plus a threshold voltage of the MOS switch plus an over-drive voltage of the MOS switch is selected to be less than a roll-off voltage of the MOS switch.

In one or more embodiments, the first transistor is configured to turn on when the MOS switch turns on to short the body of the MOS switch to its source terminal.

In one or more embodiments, the second transistor is configured to short the body of the MOS switch to the source terminal upon the occurrence of a transient voltage applied to the source terminal that exceeds the Zener voltage of the first diode plus a threshold voltage of the second transistor.

In one or more embodiments, the Zener voltage of the first diode is selected such that based on the occurrence of an electrostatic discharge event applied to the source terminal of the MOS switch which is of a voltage greater than said Zener voltage plus a threshold voltage of the second transistor, the second transistor is switched on to open a current path from the source terminal of the MOS switch, through the second transistor, the body and to the drain terminal of the MOS switch.

In one or more embodiments, the switch arrangement comprises a bi-directional MOS-based switch arrangement.

According to a second aspect of the disclosure, there is provided a battery management system including the switch arrangement of the first aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The embodiments described relate to a circuit arrangement including a bi-directional MOS based switch and further circuitry to provide electrostatic discharge, ESD, protection. The further circuitry may also improve electromagnetic compatibility and protect the switch against voltage transients caused by hot-plug events.

Figure 1:
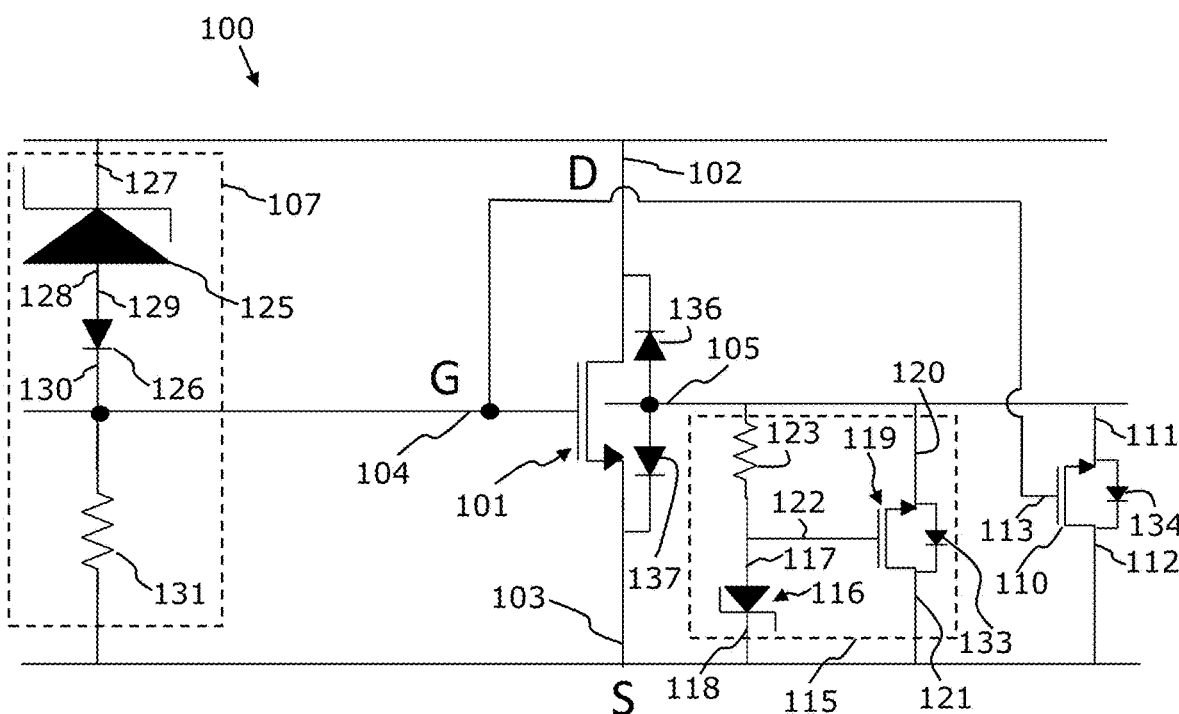
FIG. 1 shows an example embodiment of a switch arrangement.

FIG. 1 shows a switch arrangement 100 comprising a metal-oxide-semiconductor, MOS, bi-directional switch 101 (herein referred to as MOS switch) having a drain terminal 102, a source terminal 103, a gate terminal 104 and a body or substrate terminal 105. The arrangement 100 is configured as a bi-directional MOS-based switch arrangement.

The switch arrangement 100 further comprises a first clamp circuit 107 coupled between the drain terminal 102, the gate terminal 104 and the source terminal 103. The first clamp circuit 107 is configured to activate when a voltage greater than a first threshold voltage is applied to the drain terminal 102, i.e. a $V_{DS}$ voltage of the MOS switch 101 is greater than a first threshold voltage. The first clamp circuit 107, on activation, is configured to raise the voltage at the gate terminal 104 of the switch 101. The operation of the arrangement 100 and the effect of raising the gate voltage will be described in more detail below.

Returning to the switch arrangement 100, there is provided a first transistor 110 having a source terminal 111 coupled to the body 105 of the MOS switch 101, a drain terminal 112 coupled to the source terminal 103 of the MOS switch 101 and a gate terminal 113 coupled to the gate terminal 104 of the MOS switch 101. The first transistor 110 may comprises an nMOS transistor, such as an nMOS Field Effect Transistor, FET. The first transistor 110 is configured to switch on at the same time as the MOS switch 101.

The switch arrangement 100 of the present example comprises a second clamp circuit 115. The second clamp circuit 115, in the present example, comprises a first diode 116 of Zener diode type having an anode terminal 117 coupled to the body 105 of the MOS switch 101 and a cathode terminal 118 coupled to the source terminal 103. The second clamp circuit 115 further comprises a second transistor 119 having a source terminal 120 coupled to the body 105 of the MOS switch 101, a drain terminal 121 coupled to the source terminal 103 of the MOS switch 101 and a gate terminal 122 coupled to the anode terminal 117 of the first diode 116. The second transistor 119 may comprises an nMOS transistor, such as an nMOS FET or an NPN transistor.

In one or more examples, the second clamp circuit 115 further comprises a first resistor 123 having a first terminal coupled to the body 105 of the MOS switch 101 and a second terminal coupled to the anode terminal 117 of the first, Zener, diode 116 such that the anode terminal 117 of the first, Zener, diode 116 is coupled to the body 105 of the MOS switch 101 via the first resistor 123.

In one or more examples, the first clamp circuit 107 comprises a Zener diode 125, termed a second diode 125, and a third diode 126 which may be a normal p-n diode. A cathode terminal 127 of the Zener diode 125 is coupled to the drain terminal 102 and an anode terminal 128 of the Zener diode 125 is coupled to an anode terminal 129 of the third diode 126. The cathode terminal 130 of the third diode 126 is coupled to the gate terminal 104. The cathode terminal 130 is also coupled to the source terminal 103 via a second resistor 131. It will be appreciated that the first clamp circuit 107 may take other forms.

The second resistor 131 is thus electrically coupled between the gate terminal 104 and the source terminal 103 of the MOS switch 101.

In FIG. 1, the second clamp circuit 115 is shown with a fourth diode 133 representing a parasitic component of the second transistor 119. As will be understood by those skilled in the art, the parasitic fourth diode 133 or "built in body diode", in effect, has a cathode terminal coupled to the drain terminal 121 of the second transistor 119 and an anode terminal coupled to the source terminal 120 of the second transistor 119. Further, in effect, the body of the second transistor 119 is connected to its source terminal 120.

In FIG. 1, the first transistor 110 is shown with a fifth diode 134 representing a parasitic component of the first transistor 110. As will be understood by those skilled in the art, the parasitic fifth diode 134 or "built in body diode", in effect, has a cathode terminal coupled to the drain terminal 112 of the first transistor 110 and an anode terminal coupled to the source terminal 111 of the first transistor 110. Further, in effect, the body of the first transistor 110 is connected to its source terminal 111 by the parasitic fifth diode 134.

Further, in the present example, the MOS switch 101 also has parasitic components that are shown as built in body diodes 136, 167. Thus, in effect, the drain terminal 102 of the MOS switch 101 is coupled to a cathode terminal of a parasitic sixth diode 136, and the source terminal of the MOS switch is coupled to a cathode terminal of a parasitic seventh diode 137 and wherein the anode terminals of the parasitic sixth diode 136 and the parasitic seventh diode 137 are both coupled to the body 105.

In the event of a positive transient voltage applied to the drain terminal 102, such as would occur during an electrostatic discharge (ESD) event, the first clamp circuit 107 is configured to bias the gate terminal 104 of MOS switch 101 to make it conducting to allow ESD current due to the positive transient voltage to flow through the MOS switch 101.

Figure 2:
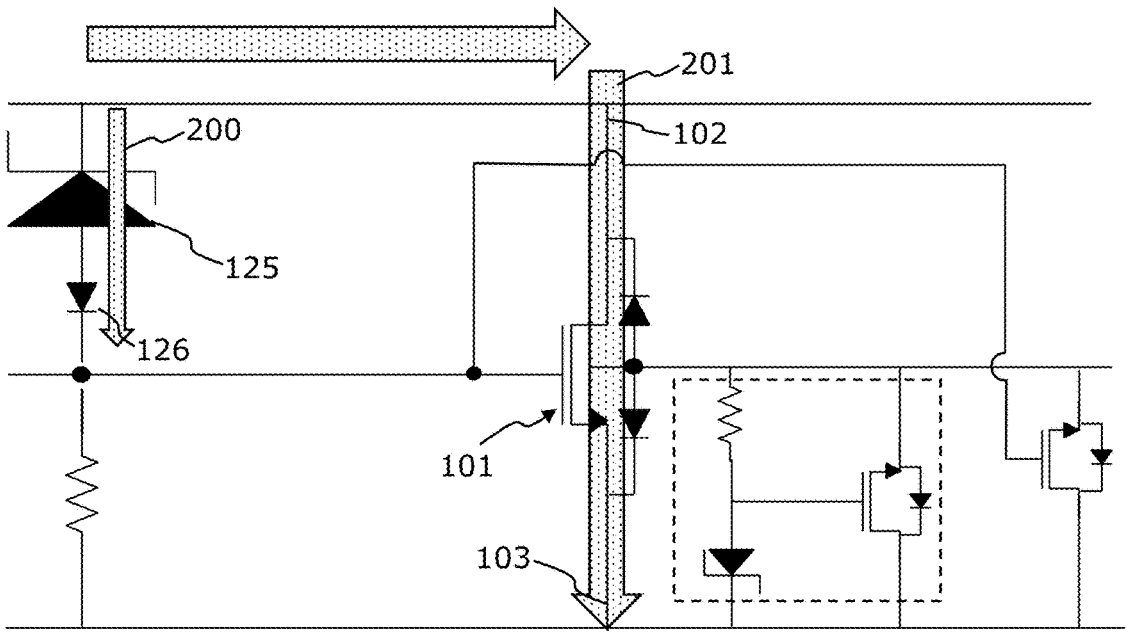
FIG. 2 shows the switch arrangement of FIG. 1 and illustrates operation during a positive ESD strike.

Example FIG. 2 illustrates the flow of current in the event of such a positive transient voltage.

As mentioned briefly above, the first clamp circuit 107 is configured to generate a gate to source voltage on the transistor of the MOS switch 101 when the drain to source voltage of the transistor of the MOS switch 101 is higher than a first threshold voltage.

The Zener voltage of the Zener diode 125 or "second diode" is $V_{ttrig\_ZD2}$. The forward threshold voltage (or "activation voltage") of the third diode is $V_{d3}$. In one or more examples, $V_{d3}$ may be approximately 0.6V. The threshold voltage of the MOS switch 101 is designated $V_{t\_MOS}$. Thus, the first threshold voltage or "clamp voltage" is the sum of $V_{t\_MOS} + V_{ttrig\_ZD2} + V_{d3}$. Accordingly, when the gate to source voltage of the transistor of the MOS switch 101 is higher than its threshold voltage, the switch will thus conduct the ESD stress current causing the drain to source voltage to be limited to $V_{t\_MOS} + V_{ttrig\_ZD2} + V_{d3} + V_{od}$. $V_{od}$ being the overdrive voltage on top of $V_{t\_MOS}$ to get the expected ESD current flowing through the MOS switch 101 with a limited Vas voltage.

Thus, when a transient is applied to the drain terminal 102 the drain-source voltage, Vas, of the MOS switch 101 may be greater than the first threshold voltage comprising $V_{t\_MOS}+V_{ttrig\_ZD2}+V_{d3}$, such that the first clamp circuit 107 causes an increase in the gate to source voltage increasing over its threshold voltage, therefore providing the drain to source voltage limitation, as described.

$$\text{i.e. } V_{DS} > V_{ttrig\_ZD2} + V_{d3} + V_{t\_MOS}$$

The first clamp circuit 107 is such that the MOS switch 101 is self-protected because the resulting flow 200 of current through the Zener diode 125 and the third diode 126 acts to raise the voltage at the gate terminal 104 up to the threshold voltage of the MOS switch 101, $V_{t\_MOS}$.

This allows the current caused by the transient voltage to follow the path 201 through the channel of the MOS switch 101 to the source terminal 103. The MOS switch is thereby protected due to the drain to source voltage limitation provided by the first clamp circuit 107.

If the roll-off voltage of the MOS switch 101 is $V_{rf}$, then the Zener voltage of the Zener diode 125, $V_{ttrig\_ZD2}$, and the forward threshold voltage of the third diode $V_{d3}$ may be chosen such that $V_{ttrig\_ZD2}+V_{d3}+V_{t\_MOS}$ is lower than $V_{rf}$. In one or more examples, a 2 to 3V overdrive voltage is provided between the desired maximum drain source voltage under ESD stress with respect to the breakdown voltage of the transistor of the MOS switch 101. Thus, such a configuration will clamp the drain source voltage $V_{DS}$ around $V_{ttrig\_ZD2}+V_{d3}+V_{GS}$, wherein $V_{GS}$ comprises the gate-source voltage of the MOS switch 101. This is advantageous because the gate source voltage of the MOS switch 101 must be at least the $V_{t\_MOS}$ level to get it conducting current between drain and source. In practice, the gate source voltage gets to few volts higher than $V_{t\_MOS}$ such that drain source on-resistance of the MOS switch×the ESD current is limiting the drain source voltage to the adequate level, such as the breakdown voltage of the MOS switch minus, for example, a margin such as 2.5 V.

In one or more examples, the resistance value of the second resistor 131 may be selected to make sure MOS switch 101 does not have a floating gate voltage that would cause excessive leakage in its channel.

As mentioned, when the MOS switch 101 is turned on, the first transistor 110 is also configured to turn on substantially simultaneously, thus shorting the body 105 of the MOS switch 101 to its source terminal 103. This is advantageous because the transient voltage capability (i.e. the drain-source voltage $V_{DS}$) of the MOS switch 101 is high, when body 105 and the source terminal 103 are shorted together, preventing the early activation of the parasitic NPN represented by the parasitic diodes 136, 137. It will be appreciated that the intention of the switch arrangement 100 may be such that Vbs (the base source voltage) of the MOS switch 101 must be low during ESD stress in order to get the maximum drain-source on resistance performance of transistor of the MOS switch 101 therefore allowing, for example, the lowest possible drain to source voltage when ESD current is flowing through its channel.

In one or more examples, the MOS switch is provided with a low on-resistance, $R_{on}$, and may therefore have a large footprint. Accordingly, in one or more examples, the first transistor 110 has a smaller footprint and is configured to turn on more rapidly than the MOS switch 101, at least during an ESD event. However, in one or more examples, the first transistor 110 is configured with an on-resistance low enough to keep the body-source voltage, VBs, of the MOS switch 101 close to 0V due to the fact that its source is also pulled up together with the gate terminal 104 due to the first clamp circuit 107.

It will be appreciated that the first transistor 110 has a smaller size than the MOS switch 101 and therefore the current flow into the first transistor 110 is much lower than into the MOS switch 101.

Figure 3:
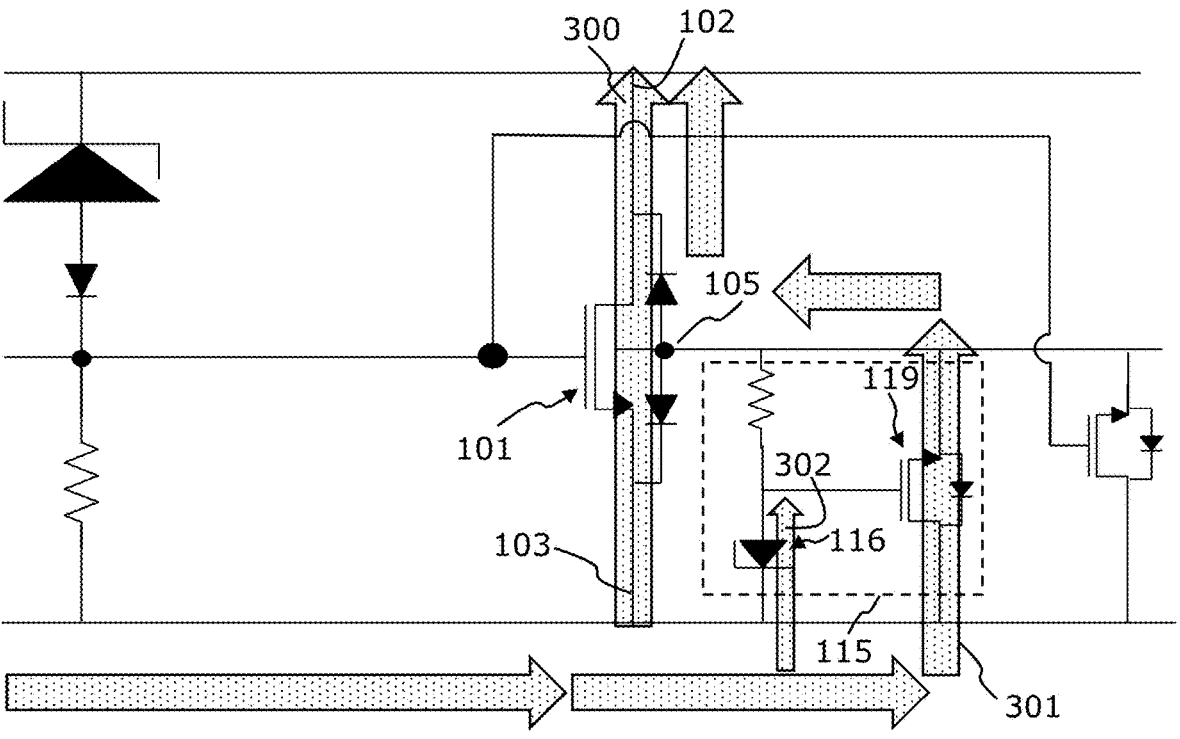
FIG. 3 shows the switch arrangement of FIG. 1 and illustrates operation during a negative ESD strike.

Example FIG. 3 illustrates the flow of current in the event of a negative transient voltage. In the present example, it is primarily the second clamp circuit 115 that is configured to protect the MOS switch 101 against transient voltage events applied at the source terminal 103, i.e. a transient voltage applied as a source-drain voltage, $V_{SD}$, of the MOS switch 101.

The second clamp circuit 115 may act differently depending on whether the voltage transient at the source terminal 103 is a fast transient or a relatively slower transient, such as one that may occur during a hot-plug situation.

During a fast transient voltage applied at the source terminal 103, then the transient may be of a sufficiently high voltage for the MOS switch 101 to be turned on in reverse, that is if the gate-drain voltage is >0. Thus, the first diode 116 acts to control the gate source voltage of the second transistor 119 to cause the second transistor 119 to conduct to receive the ESD current during a fast transient voltage applied at the source terminal 103, leading to limit the body to source voltage of the MOS switch 101. It may also be noted that the body to drain voltage of the MOS switch 101 may be also limited to around 0.6V due to the built-in body diode 136 between body and drain, and therefore the $V_{sd}$ voltage of the MOS switch 101 is also limited in response to negative ESD stress. A current path 300 is also generated due to the gate 104 being connected to the source 103 via the second resistor 131 which results in the MOS switch 101 having a gate drain voltage that makes the channel also conduct negative ESD current.

The first diode 116, on occurrence of voltage transients at the source terminal 103 may be configured to provide a gate voltage at the gate of the second transistor 119. The second transistor 119 is turned on provided the transient voltage is greater than the Zener voltage of the first, Zener, diode 116 and the threshold voltage of the second transistor 119. This is advantageous, because the second circuit 115 is configured to, in the event of a transient voltage applied at the source terminal that exceeds the Zener voltage of the first diode 116 (e.g. $V_{SD}>V_{ttrig\_ZD1}+V_{t\_2nd\_transistor}$), provide for switching on of the second transistor 119 to provide a current path 301 from the source terminal 103, through the channel of the second transistor 119, through the body 105 and to the drain terminal 102. This may be more likely to occur if the MOS switch 101 is smaller.

During a slower transient voltage applied at the source terminal 103 (which may occur during a hot-plug event), then the MOS switch 101 may not be susceptible to being turned on in reverse. Then, again, the second transistor 119 may be configured to turn on, provided the transient voltage is greater than the Zener voltage of the first, Zener, diode 116 plus its threshold voltage. Thus, the second clamp circuit 115 is configured to, in the event of a (slower) transient voltage applied at the source terminal 103 that exceeds the Zener voltage of the first diode 116 and the threshold voltage of the second transistor 119, provide for switching on of the second transistor 119, due to reverse current flow 302 through the first, Zener, diode 116 to the gate of the second transistor 119. As before, this provides a current path 301 from the source terminal 103, through the channel of the second transistor 119, through the body 105 and to the drain terminal 102.

In summary, in the event of a negative transient, i.e. one applied at the source terminal, the second clamp circuit 115, by virtue of the action of the first diode 116 and the second transistor 119, is configured to short the body 105 to the source terminal 103 which gives the opportunity for self protection of the MOS switch.

It will be appreciated that the triggering of the second transistor 119 can clamp the source-drain voltage of the MOS switch to a desired value by the Zener voltage of the first, Zener, diode 116.

The first clamp circuit 107 and the second clamp circuit 115 are named as such because at least one of their functions, in some examples, is to clamp a terminal-to-terminal voltage of the MOS switch 101. However, it will be appreciated that the first clamp circuit 107 and the second clamp circuit 115 may be referred to more generally as a first circuit 107 and a second circuit 115.

Figure 4:
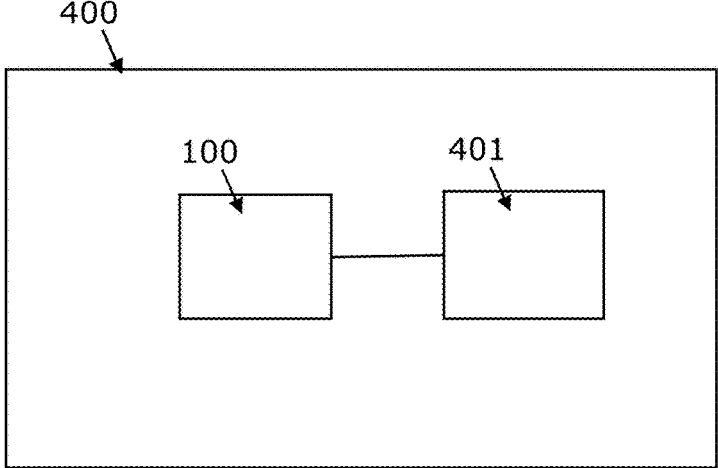
FIG. 4 shows an example battery management system.

The switch arrangement 100 of the present disclosure has particular application in a battery management system. Thus, FIG. 4 shows a battery management system 400 including the switch arrangement 100 of preceding embodiments for coupling to a battery 401. In such an implementation, several switch arrangements 100 may be provided together and coupled to the battery pack 401.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A switch arrangement comprising:
    a bi-directional metal-oxide-semiconductor (MOS) switch having a drain terminal, a source terminal, a gate terminal and a body;
    a first circuit coupled between the drain terminal, the gate terminal and the source terminal for providing electrostatic discharge protection;
    a first transistor having a source terminal coupled to the body of the MOS switch, a drain terminal coupled to the source terminal of the MOS switch and a gate terminal coupled to the gate terminal of the MOS switch; and
    a second circuit for providing electrostatic discharge protection comprising a first diode of Zener diode type having an anode terminal coupled to the body of the MOS switch and a cathode terminal coupled to the source terminal, and a second transistor having a source terminal coupled to the body of the MOS switch, a drain terminal coupled to the source terminal of the MOS switch and a gate terminal coupled to the anode terminal of the first diode.

2. The switch arrangement of claim 1, wherein the second circuit further comprises a first resistor having a first terminal coupled to the body of the MOS switch and a second terminal coupled to the anode terminal of the first diode such that the anode terminal of the first diode is coupled to the body of the MOS switch via the first resistor in series.

3. The switch arrangement of claim 2, wherein the first circuit comprises:
    a second diode of Zener diode type and a third diode,
    wherein a cathode terminal of the second diode is coupled to the drain terminal and an anode terminal of the second diode is coupled to an anode terminal of the third diode, and the cathode terminal of the third diode is coupled to the gate terminal.

4. The switch arrangement of claim 2, wherein the first transistor is configured to turn on when the MOS switch turns on to short the body of the MOS switch to its source terminal.

5. The switch arrangement of claim 2, wherein the second transistor is configured to short the body of the MOS switch to the source terminal upon the occurrence of a transient voltage applied to the source terminal that exceeds the Zener voltage of the first diode plus a threshold voltage of the second transistor.

6. The switch arrangement of claim 2, wherein the Zener voltage of the first diode is selected such that based on the occurrence of an electrostatic discharge event applied to the source terminal of the MOS switch which is of a voltage greater than said Zener voltage plus a threshold voltage of the second transistor, the second transistor is switched on to open a current path from the source terminal of the MOS switch, through the second transistor, the body and to the drain terminal of the MOS switch.

7. The switch arrangement of claim 1, wherein the first circuit comprises:
    a second diode of Zener diode type and a third diode,
    wherein a cathode terminal of the second diode is coupled to the drain terminal and an anode terminal of the second diode is coupled to an anode terminal of the third diode, and the cathode terminal of the third diode is coupled to the gate terminal.

8. The switch arrangement of claim 7, wherein the first circuit further comprises a second resistor connected between the gate terminal and the source terminal.

9. The switch arrangement of claim 8, wherein a forward threshold voltage of the third diode plus a Zener voltage of the second diode plus a threshold voltage of the MOS switch plus an overdrive voltage of the MOS switch is selected to be less than a roll-off voltage of the MOS switch.

10. The switch arrangement of claim 7, wherein a forward threshold voltage of the third diode plus a Zener voltage of the second diode plus a threshold voltage of the MOS switch plus an overdrive voltage of the MOS switch is selected to be less than a roll-off voltage of the MOS switch.

11. The switch arrangement of claim 1, wherein the first transistor comprises an nMOS MOSFET.

12. The switch arrangement of claim 1, wherein the second transistor comprises an nMOS FET.

13. The switch arrangement of claim 1, wherein the second transistor comprises an NPN transistor.

14. The switch arrangement of claim 1, wherein the MOS switch is provided with an on-resistance lower than the on-resistance of the first transistor.

15. The switch arrangement of claim 1, wherein MOS switch is an n-channel MOS switch.

16. The switch arrangement of claim 1, wherein the first transistor is configured to turn on when the MOS switch turns on to short the body of the MOS switch to its source terminal.

17. The switch arrangement of claim 1, wherein the second transistor is configured to short the body of the MOS switch to the source terminal upon the occurrence of a transient voltage applied to the source terminal that exceeds the Zener voltage of the first diode plus a threshold voltage of the second transistor.

18. The switch arrangement of claim 1, wherein the Zener voltage of the first diode is selected such that based on the occurrence of an electrostatic discharge event applied to the source terminal of the MOS switch which is of a voltage greater than said Zener voltage plus a threshold voltage of the second transistor, the second transistor is switched on to open a current path from the source terminal of the MOS switch, through the second transistor, the body and to the drain terminal of the MOS switch.

19. The switch arrangement of claim 1, wherein the switch arrangement comprises a bi-directional MOS-based switch arrangement.

20. A battery management system including the switch arrangement of claim 1.

\* \* \* \* \*